United States Patent
Nishina et al.

(10) Patent No.: US 9,527,396 B2
(45) Date of Patent: Dec. 27, 2016

(54) ABNORMALITY DETECTION DEVICE

(71) Applicant: HONDA MOTOR CO., LTD., Tokyo (JP)

(72) Inventors: Masatoshi Nishina, Utsunomiya (JP); Kazuya Iwamoto, Utsunomiya (JP); Yusuke Takahashi, Utsunomiya (JP)

(73) Assignee: HONDA MOTOR CO., LTD., Tokyo (JP)

( * ) Notice: Subject to any disclaimer, the term of this patent is extended or adjusted under 35 U.S.C. 154(b) by 246 days.

(21) Appl. No.: 14/314,154

(22) Filed: Jun. 25, 2014

(65) Prior Publication Data

US 2015/0009595 A1 Jan. 8, 2015

(30) Foreign Application Priority Data

Jul. 3, 2013 (JP) ................................ 2013-140165

(51) Int. Cl.
- *H02H 9/04* (2006.01)
- *B60L 11/18* (2006.01)
- *H01M 10/42* (2006.01)
- *H01M 10/48* (2006.01)
- *G01R 31/36* (2006.01)

(52) U.S. Cl.
CPC ........ *B60L 11/1851* (2013.01); *H01M 10/425* (2013.01); *H01M 10/486* (2013.01); *G01R 31/3606* (2013.01); *H01M 2010/4271* (2013.01); *Y02T 10/705* (2013.01); *Y02T 10/7005* (2013.01)

(58) Field of Classification Search
CPC . B60L 11/1851; H01M 10/425; H01M 10/486
See application file for complete search history.

(56) References Cited

U.S. PATENT DOCUMENTS

| | | |
|---|---|---|
| 2004/0150926 A1 | 8/2004 | Wilk et al. |
| 2005/0189923 A1* | 9/2005 | Ohishi ............... H02J 7/022 320/138 |
| 2006/0083031 A1 | 4/2006 | Cook, II |
| 2007/0170899 A1 | 7/2007 | Lee et al. |
| 2008/0018304 A1 | 1/2008 | Litingtun et al. |
| 2012/0235473 A1 | 9/2012 | Jiang et al. |

FOREIGN PATENT DOCUMENTS

| | | |
|---|---|---|
| CA | 2559291 | 3/2007 |
| CN | 201797012 | 4/2011 |

(Continued)

OTHER PUBLICATIONS

Japanese Office action dated Jun. 30, 2015, English translation included.

(Continued)

*Primary Examiner* — Thienvu Tran
*Assistant Examiner* — Tien Mai
(74) *Attorney, Agent, or Firm* — Rankin, Hill & Clark LLP

(57) ABSTRACT

An abnormality detection device includes a temperature detection unit that has a resistor section which varies a resistance value depending on a temperature, a resistance detection unit that detects a resistance value of the resistor section, and a short-circuit unit that short-circuits the resistor section, in which the short-circuit unit short-circuits the resistor section when a predetermined abnormality occurs in a detection target of the temperature detection unit.

3 Claims, 2 Drawing Sheets

(56) References Cited

FOREIGN PATENT DOCUMENTS

| | | |
|---|---|---|
| JP | 2009-208639 | 9/2009 |
| JP | 2010-115070 | 5/2010 |
| JP | 2010-195336 | 9/2010 |
| JP | 2012-210113 | 10/2012 |
| JP | 2012210113 | * 10/2012 |

OTHER PUBLICATIONS

Japanese Office Action with English Translation dated Feb. 24, 2015, 6 pages.
European Search Report dated Feb. 25, 2015, 6 pages.
Chinese Office Action dated Jul. 13, 2016, English translation of part of search report included.

* cited by examiner

ABNORMALITY DETECTION DEVICE

CROSS-REFERENCE TO RELATED APPLICATION

Priority is claimed on Japanese Patent Application No. 2013-140165, filed on Jul. 3, 2013, the content of which is incorporated herein by reference.

BACKGROUND

Field of the Invention

The present invention relates to an abnormality detection device.

Description of Related Art

In the related art, a vehicle power source device is known in which a DC-DC converter is connected between a main power source connected to an electrical load and a subsidiary power source connected to a generator, and a switch is provided between the main power source and the subsidiary power source (for example, refer to Japanese Unexamined Patent Application, First Publication No. 2010-195336).

SUMMARY

In the vehicle power source device according to the related art, in a case where the main power source or the subsidiary power source is battery modules formed by a plurality of battery cells, there is a concern that a plurality of monitor lines connected to each battery module may be necessary in order to monitor a voltage of each battery module, and thus a device configuration may be complex.

The present invention has been made in consideration of the circumstances, and an object thereof is to provide an abnormality detection device capable of preventing a device configuration such as a connection line from being complex.

The present invention employs the following aspects in order to solve the problem and achieve the associated object.

(1) According to an aspect of the present invention, there is provided an abnormality detection device including a temperature detection unit that includes a resistor section which varies a resistance value depending on a temperature; a resistance detection unit configured to detect a resistance value of the resistor section; and a short-circuit unit configured to short-circuit the resistor section, in which the short-circuit unit short-circuits the resistor section when a predetermined abnormality occurs in a detection target of the temperature detection unit.

(2) In the aspect of (1), the abnormality detection device may further include an overvoltage detection unit configured to detect whether or not an overvoltage occurs in a storage battery, the temperature detection unit may detect a temperature of the storage battery, and the short-circuit unit may determine that the predetermined abnormality has occurred when an overvoltage of the storage battery is detected by the overvoltage detection unit.

(3) In the aspect of (2), the storage battery may include a plurality of capacitors connected in series to each other, the overvoltage detection unit may detect whether or not an overvoltage occurs in each of the plurality of capacitors, and the short-circuit unit may determine that the predetermined abnormality has occurred when an overvoltage of at least one of the plurality of capacitors is detected by the overvoltage detection unit.

(4) In the aspect of (2) or (3), the abnormality detection device may further include a voltage control unit that controls a voltage of the storage battery, and the voltage control unit may reduce a voltage of the storage battery when the predetermined abnormality has occurred.

According to the abnormality detection device related to the aspect disclosed in the above (1), for example, in a case where there are a plurality of detection targets of the temperature detection unit, and it is detected whether or not an abnormality has occurred in any one of the plurality of detection targets, it is possible to detect whether or not an abnormality has occurred only with a connection line connected to the resistance detection unit without needing to connect the connection line to the plurality of detection targets. Accordingly, it is possible to prevent a device configuration from being complex.

In addition, in a case of the above (2), it is possible to detect an overvoltage of the storage battery only with a connection line connected to the resistance detection unit.

Further, in a case of the above (3), it is possible to detect an overvoltage of at least one of the plurality of capacitors only with a connection line connected to the resistance detection unit.

Furthermore, in a case of the above (4), it is possible to eliminate an overvoltage when an overvoltage of the storage battery occurs, and also it is possible to detect whether either a short circuit controlled by the short-circuit unit or a short circuit due to an abnormality which does not follow control of the short-circuit unit occurs, by detecting whether or not a short circuit of the resistor section is removed in accordance with a reduction in a voltage of the storage battery.

DESCRIPTION OF THE EMBODIMENT

Hereinafter, an abnormality detection device according to an embodiment of the present invention will be described with reference to the accompanying drawings.

Figure 1:
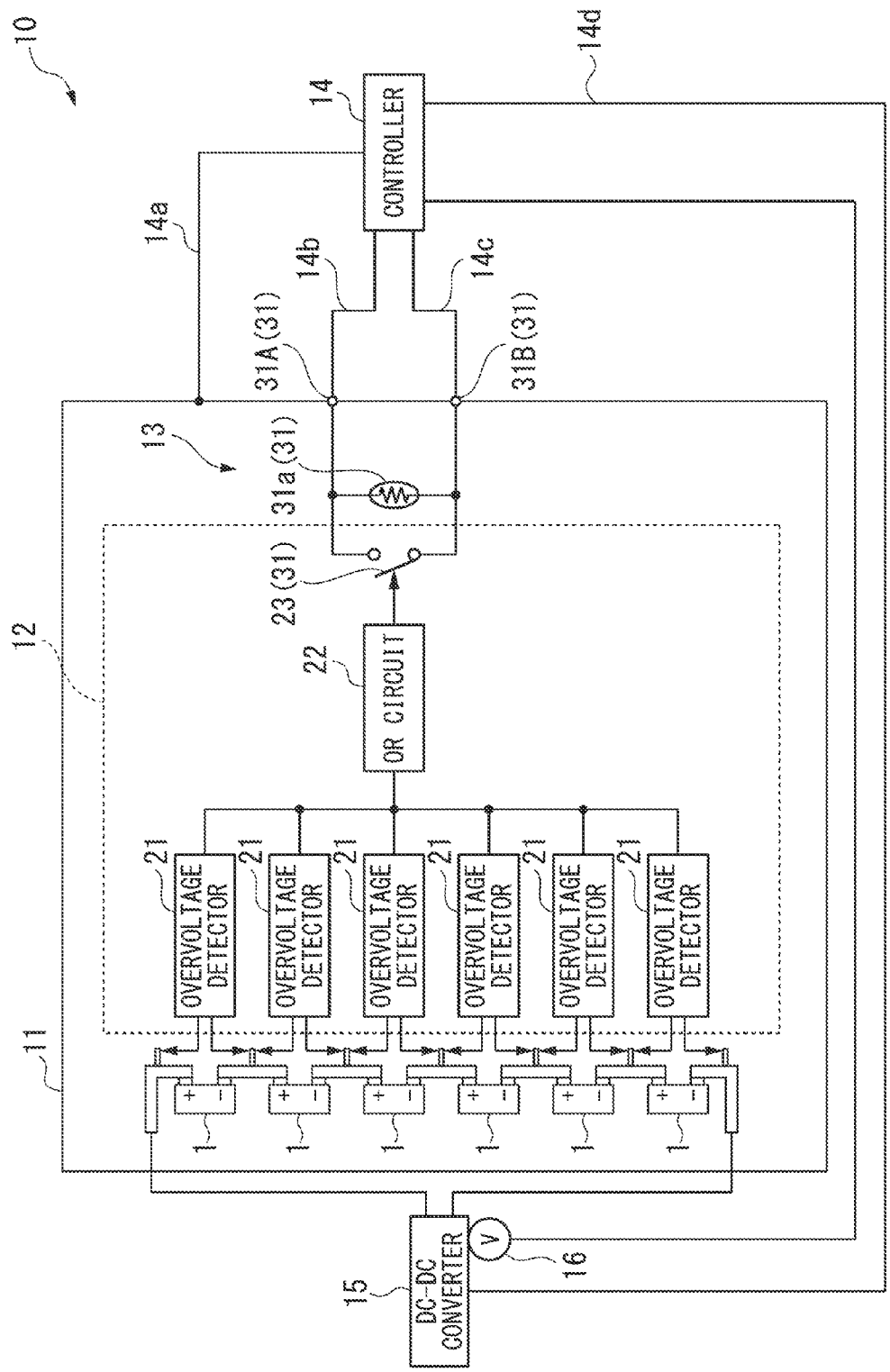
FIG. 1 is a configuration diagram of an abnormality detection device according to an embodiment of the present invention.

An abnormality detection device 10 according to the present embodiment can detect whether or not at least one of a plurality of capacitor cells 1 outputs an overvoltage as an abnormality of a capacitor 11 (capacitor module, storage battery) formed by the plurality of capacitor cells 1 which are connected in series to each other, for example, as illustrated in FIG. 1.

The abnormality detection device 10 includes, for example, an abnormality detection unit 12, a temperature detection unit 13, and a controller (resistance detection unit) 14. The abnormality detection unit 12 includes a plurality of overvoltage detectors 21 provided at the plurality of respective capacitor cells 1, an OR circuit (a short-circuit unit, a voltage control unit) 22 connected to the plurality of overvoltage detectors 21, and a short-circuit portion 23 which is controlled by the OR circuit 22.

The capacitor cell 1 is, for example, an electric double layer capacitor, an electrolytic capacitor, a lithium ion capacitor, or the like. The plurality of capacitor cells 1 are connected in series to each other so as to form the capacitor (capacitor module) 11.

The overvoltage detector 21 detects whether or not an output voltage of the capacitor cell 1 is higher than a predetermined threshold voltage. The overvoltage detector 21 determines that an overvoltage of the capacitor cell 1 occurs if the output voltage of the capacitor cell 1 is higher than the predetermined threshold voltage, and reduces the output voltage of the capacitor cell 1 by discharging the capacitor cell 1.

The OR circuit 22 is connected to the plurality of overvoltage detectors 21 and the short-circuit portion 23. The OR circuit 22 short-circuits the short-circuit portion 23 in a case where at least one of the plurality of overvoltage detectors 21 detects an overvoltage of the capacitor cell 1.

The short-circuit portion 23 is provided in a resistor section 31 of the temperature detection unit 13. The short-circuit portion 23 includes a switch or the like which is controlled to be turned on and off by the OR circuit 22. The short-circuit portion 23 short-circuits positive side and negative side output terminals 31A and 31B of the resistor section 31 under the control of the OR circuit 22.

The temperature detection unit 13 includes the resistor section 31 which varies a resistance value depending on a temperature. The resistor section 31 includes, for example, a thermistor 31a, and the short-circuit portion 23 which can short-circuit both ends of the thermistor 31a. The thermistor 31a has a characteristic in which a resistance value tends to increase or tends to decrease in accordance with an increase in a temperature. A voltage corresponding to a temperature and a resistance value of the thermistor 31a is output from both ends of the thermistor 31a (that is, between the positive side and negative side output terminals 31A and 31B of the resistor section 31). In addition, information on a characteristic and an operation range (for example, a range of a resistance value) of the thermistor 31a is stored in the controller 14 in advance.

The short-circuit portion 23 is provided so as to short-circuit both ends of the thermistor 31a in a resistance value lower than a predetermined value (for example, a resistance value lower than a lower limit resistance value of the operation range of the thermistor 31a). The short-circuit portion 23 does not short-circuit both ends of the thermistor 31a in a preset state, and short-circuits both ends of the thermistor 31a under the control of the OR circuit 22. Accordingly, the short-circuit portion 23 generates a voltage corresponding to a resistance value lower than the predetermined value, which does not depend on a temperature of the thermistor 31a, between the positive side and negative side output terminals 31A and 31B of the resistor section 31 when both ends of the thermistor 31a are short-circuited.

The controller 14 is connected to the capacitor 11 via a power line 14a for supplying power and is also connected to the temperature detection unit 13 via two connection lines 14b and 14c for detecting a voltage between the positive side and negative side output terminals 31A and 31B of the resistor section 31 of the temperature detection unit 13.

The controller 14 is connected to a DC-DC converter 15 which can control charge and discharge of the capacitor 11 via a control line 14d for transmitting a control signal. In addition, the controller 14 is connected to a voltage sensor 16 which detects an output voltage of the capacitor 11 (a capacitor voltage, that is, a total voltage of the plurality of capacitor cells 1 connected in series).

The controller 14 controls charge and discharge of the capacitor 11 by using, for example, the DC-DC converter 15 connected to the capacitor 11. The controller 14 is connected to the temperature detection unit 13, and detects a resistance value and a temperature of the resistor section 31 in accordance with a voltage value between the positive side and negative side output terminals 31A and 31B, output from the resistor section 31 of the temperature detection unit 13, by referring to the prestored information on the characteristics of the resistor section 31 of the temperature detection unit 13.

The controller 14 determines that a short circuit occurs in the resistor section 31 in a case where a resistance value is lower than the prestored lower limit resistance value of the operation range of the thermistor 31a by using the voltage value output from the temperature detection unit 13, and reduces a voltage of the capacitor 11 by discharging the capacitor 11.

The abnormality detection device 10 according to the present embodiment has the above-described configuration, and, next, an operation of the abnormality detection device 10 will be described.

Figure 2:
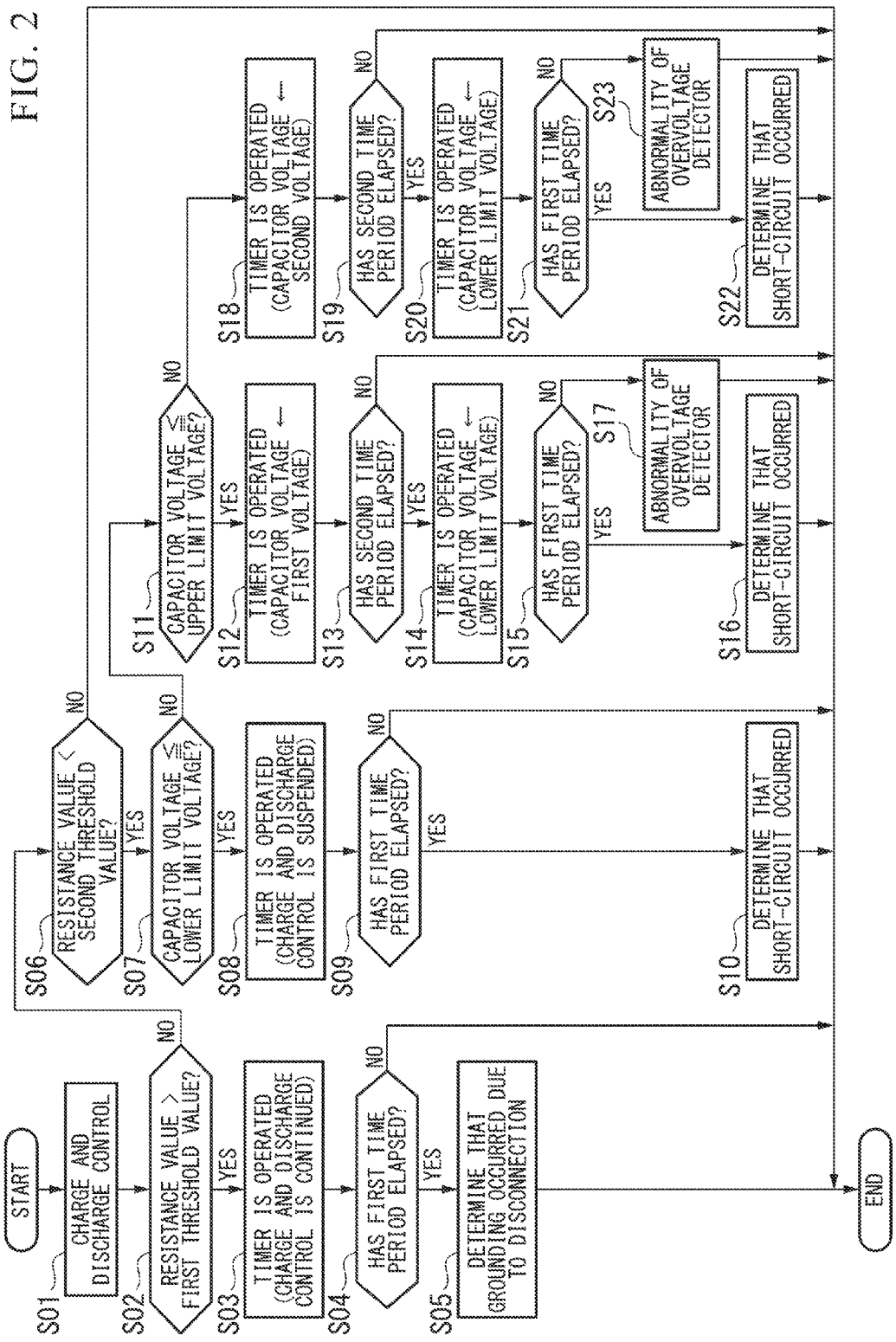
FIG. 2 is a flowchart illustrating an operation of the abnormality detection device according to the embodiment of the present invention.

First, for example, in step S01 illustrated in FIG. 2, the controller 14 controls charge and discharge of the capacitor 11 by using the DC-DC converter 15 connected to the capacitor 11.

Next, in step S02, the controller 14 determines whether or not a resistance value of the resistor section 31 is greater than a predetermined first threshold value.

If a determination result thereof is "NO", the flow proceeds to step S06 which will be described later. On the other hand, if the determination result is "YES", the flow proceeds to step S03.

In addition, the predetermined first threshold value is, for example, a preset upper limit resistance value or the like of an operation range of the thermistor 31a.

Next, in step S03, the controller 14 performs clocking by using a timer (not illustrated) while continuously controlling charge and discharge of the capacitor 11. Accordingly, the controller 14 measures duration of a state in which a resistance value of the resistor section 31 is greater than the predetermined first threshold value.

Next, in step S04, the controller 14 determines whether or not the duration of a state in which a resistance value of the resistor section 31 is greater than the predetermined first threshold value reaches a first time period or more.

If a determination result thereof is "NO", that is, the resistance value of the resistor section 31 is reduced to the predetermined first threshold value or less before the first time period has elapsed, the process ends.

On the other hand, if the determination result is "YES", the flow proceeds to step S05.

Next, in step S05, the controller 14 determines that grounding occurs due to disconnection in the resistor section 31, and discharges the capacitor 11 so as to reduce a capacitor voltage to a predetermined lower limit voltage, and the process ends.

Next, in step S06, the controller 14 determines whether or not the resistance value of the resistor section 31 is lower than a predetermined second threshold value which is lower than the first threshold value.

If a determination result thereof is "NO", the process ends.

On the other hand, if the determination result is "YES", the flow proceeds to step S07.

In addition, the predetermined second threshold value is, for example, a preset lower limit resistance value or the like of the operation range of the thermistor 31a.

Next, in step S07, the controller 14 determines whether or not a capacitor voltage is equal to or less than a predetermined lower limit voltage.

If a determination result is "NO", the flow proceeds to step S11 described later.

On the other hand, if the determination result is "YES", the flow proceeds to step S08.

In addition, the predetermined lower limit voltage is a lower limit output voltage (for example, a voltage or the like necessary to restart a vehicle in an idle stop state) or the like which is necessary in a system such as the vehicle provided with the capacitor 11.

Next, in step S08, the controller 14 suspends (that is, stops) control of charge and discharge of the capacitor 11, and performs clocking by using the timer (not illustrated). Accordingly, the controller 14 measures duration of a state in which a resistance value of the resistor section 31 is lower than the predetermined second threshold value.

Next, in step S09, the controller 14 determines whether or not the duration of a state in which a resistance value of the resistor section 31 is lower than the predetermined second threshold value reaches the first time period or more.

If a determination result thereof is "NO", that is, the resistance value of the resistor section 31 increases to the predetermined second threshold value or more before the first time period has elapsed, the process ends.

On the other hand, if the determination result is "YES", the flow proceeds to step S10.

In addition, in step S10, the controller 14 determines that a short circuit occurs due to any abnormality which does not follow control of the OR circuit 22 in the resistor section 31 and discharges the capacitor 11 so as to reduce a voltage of the capacitor 11 to a predetermined lower limit voltage, and the process ends.

Next, in step S11, the controller 14 determines whether or not a capacitor voltage is equal to or less than a predetermined upper limit voltage.

If a determination result thereof is "NO", the process proceeds to step S18 described later.

On the other hand, if the determination result is "YES", the flow proceeds to step S12.

In addition, the predetermined upper limit voltage is, for example, a preset upper limit output voltage or the like of the operation range of the capacitor 11.

Next, in step S12, the controller 14 performs clocking by using the timer (not illustrated) while continuously controlling charge and discharge of the capacitor 11 so that a capacitor voltage becomes a predetermined first voltage or less which is lower than the upper limit voltage. Accordingly, the controller 14 measures duration of a state in which a resistance value of the resistor section 31 is lower than the predetermined second threshold value.

Next, in step S13, the controller 14 determines whether or not the duration of a state in which a resistance value of the resistor section 31 is lower than the predetermined second threshold value reaches a second time period or more.

If a determination result thereof is "NO", that is, the resistance value of the resistor section 31 increases to the predetermined second threshold value or more before the second time period has elapsed, the process ends.

On the other hand, if the determination result is "YES", the flow proceeds to step S14.

Next, in step S14, the controller 14 determines that a short circuit occurs due to any abnormality which does not follow control of the OR circuit 22 in the resistor section 31, and discharges the capacitor 11 so as to reduce a voltage of the capacitor 11 to a predetermined lower limit voltage, and performs clocking by using the timer (not illustrated). Accordingly, the controller 14 measures duration of a state in which a resistance value of the resistor section 31 is lower than the predetermined second threshold value.

Next, in step S15, the controller 14 determines whether or not the duration of a state in which a resistance value of the resistor section 31 is lower than the predetermined second threshold value reaches the first time period or more.

If a determination result thereof is "NO", that is, the resistance value of the resistor section 31 increases to the predetermined second threshold value or more before the first time period has elapsed, the process proceeds to step S17 which will be described later.

On the other hand, if the determination result is "YES", the flow proceeds to step S16.

In addition, in step S16, the controller 14 determines that a short circuit occurs due to any abnormality which does not follow control of the OR circuit 22 in the resistor section 31 and discharges the capacitor 11 so as to reduce a voltage of the capacitor 11 to the predetermined lower limit voltage, and the process ends.

Further, in step S17, the controller 14 determines that an abnormality occurs in a function of reducing an output voltage by discharging the capacitor cell 1 in a case where an overvoltage of the capacitor cell 1 occurs in relation to at least one of the plurality of overvoltage detectors 21, and the process ends.

Next, in step S18, the controller 14 performs clocking by using the timer (not illustrated) while continuously controlling charge and discharge of the capacitor 11 so that a capacitor voltage becomes a predetermined second voltage or less which is lower than the upper limit voltage. Accordingly, the controller 14 measures duration of a state in which a resistance value of the resistor section 31 is lower than the predetermined second threshold value.

Next, in step S19, the controller 14 determines whether or not the duration of a state in which a resistance value of the resistor section 31 is lower than the predetermined second threshold value reaches the second time period or more.

If a determination result thereof is "NO", that is, the resistance value of the resistor section 31 increases to the predetermined second threshold value or more before the second time period has elapsed, the process ends.

On the other hand, if the determination result is "YES", the flow proceeds to step S20.

Next, in step S20, the controller 14 determines that a short circuit occurs due to any abnormality which does not follow control of the OR circuit 22 in the resistor section 31, and discharges the capacitor 11 so as to reduce a voltage of the capacitor 11 to the predetermined lower limit voltage, and performs clocking by using the timer (not illustrated). Accordingly, the controller 14 measures duration of a state in which a resistance value of the resistor section 31 is lower than the predetermined second threshold value.

Next, in step S21, the controller 14 determines whether or not the duration of a state in which a resistance value of the resistor section 31 is lower than the predetermined second threshold value reaches the first time period or more.

If a determination result thereof is "NO", that is, the resistance value of the resistor section 31 increases to the predetermined second threshold value or more before the first time period has elapsed, the process proceeds to step S23 described later.

On the other hand, if the determination result is "YES", the flow proceeds to step S22.

In addition, in step S22, the controller 14 determines that a short circuit occurs due to any abnormality which does not follow control of the OR circuit 22 in the resistor section 31 and discharges the capacitor 11 so as to reduce a voltage of the capacitor 11 to the predetermined lower limit voltage, and the process ends.

Further, in step S23, the controller 14 determines that an abnormality occurs in a function of reducing an output voltage by discharging the capacitor cell 1 in a case where an overvoltage of the capacitor cell 1 occurs in relation to at least one of the plurality of overvoltage detectors 21, and the process ends.

As described above, according to the abnormality detection device 10 of the present embodiment, an overvoltage of any one of the plurality of capacitor cells 1 can be detected only with the connection lines 14b and 14c connected to the temperature detection unit 13 and the controller 14 without needing connection lines for connecting the controller 14 to the plurality of capacitor cells 1. Accordingly, it is possible to prevent a device configuration from being complex.

In addition, since the capacitor 11 is discharged in a case where a resistance value of the resistor section 31 is lower than the second threshold value and a capacitor voltage is higher than the lower limit voltage, even when an overvoltage occurs in any one of the plurality of capacitor cells 1, the overvoltage which has occurred can be removed.

Further, since it is determined whether or not a resistance value of the resistor section 31 increases to the second threshold value or more in a case where a capacitor voltage is reduced by discharging the capacitor 11, it is possible to accurately discriminate a short circuit controlled by the OR circuit 22 from a short circuit due to any abnormality which does not follow control of the OR circuit 22.

Furthermore, the technical scope of the present invention is not limited to the above-described embodiment, and includes various modifications of the above-described embodiment within the range without departing from the spirit of the present invention. In other words, the configuration of the above-described embodiment is only an example and may be modified as appropriate.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An abnormality detection device comprising:
a temperature detection unit that includes a resistor section which varies a resistance value depending on a temperature and that detects a temperature of a storage battery;
a resistance detection unit configured to detect a resistance value of the resistor section; and
a short-circuit unit configured to short-circuit the resistor section,
an overvoltage detection unit configured to detect whether or not an overvoltage occurs in the storage battery,
a voltage control unit that controls a voltage of the storage battery,
wherein the short-circuit unit short-circuits the resistor section when the overvoltage of the storage battery is detected by the overvoltage detection unit,
wherein the overvoltage detection unit reduces an output voltage of the storage battery when the overvoltage of the storage battery is detected,
wherein the voltage control unit controls the voltage of the storage battery so that the voltage of the storage battery becomes a predetermined voltage or less when the resistance detection unit has detected that the resistance value is less than a predetermined threshold, controls the voltage of the storage battery so that the voltage of the storage battery becomes a predetermined lower limit voltage when a duration of a state in which the resistance value is less than the predetermined threshold reaches a predetermined first time period or more, and determines that an abnormality is occurring in a reducing function of the output voltage in the overvoltage detection unit when the resistance value increases to the predetermined threshold or more before a predetermined second time has elapsed, the predetermined second time being a time since the control for reducing the voltage of the storage battery to the predetermined lower limit voltage was started.

2. The abnormality detection device according to claim 1, wherein the storage battery includes a plurality of capacitors connected in series to each other,
wherein the overvoltage detection unit detects whether or not an overvoltage occurs in each of the plurality of capacitors, and
wherein the short-circuit unit short circuits the resistor section when the overvoltage of at least one of the plurality of capacitors is detected by the overvoltage detection unit.

3. The abnormality detection device according to claim 2, comprising a plurality of the overvoltage detection units,
wherein the overvoltage detection units reduce output voltages of the capacitors when it is determined that the overvoltage is occurring in at least one of the plurality of capacitors,
wherein the voltage control unit determines that an abnormality is occurring in a reducing function of the output voltage in at least one of the plurality of overvoltage detection units when the resistance value increases to the predetermined threshold or more before the predetermined second time has elapsed, the predetermined second time being a time since the control for reducing the voltage of the storage battery to the predetermined lower limit voltage was started.

* * * * *